(12) United States Patent
Shintani et al.

(10) Patent No.: US 10,303,427 B2
(45) Date of Patent: May 28, 2019

(54) MOVING AUDIO FROM CENTER SPEAKER TO PERIPHERAL SPEAKER OF DISPLAY DEVICE FOR MACULAR DEGENERATION ACCESSIBILITY

(71) Applicant: Sony Corporation, Tokyo (JP)

(72) Inventors: Peter Shintani, San Diego, CA (US); Brant Candelore, Escondido, CA (US); Mahyar Nejat, San Diego, CA (US)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/646,550

(22) Filed: Jul. 11, 2017

(65) Prior Publication Data
US 2019/0018640 A1    Jan. 17, 2019

(51) Int. Cl.
*H04R 5/02* (2006.01)
*G06F 3/16* (2006.01)
*H03G 3/30* (2006.01)
*H04R 3/12* (2006.01)

(52) U.S. Cl.
CPC ............ *G06F 3/165* (2013.01); *H03G 3/3005* (2013.01); *H04R 3/12* (2013.01)

(58) Field of Classification Search
CPC .............................. H04S 7/302; H04S 7/303
See application file for complete search history.

(56) References Cited

U.S. PATENT DOCUMENTS

| | | |
|---|---|---|
| 6,195,640 B1 | 2/2001 | Mullaly et al. |
| 7,110,951 B1 | 9/2006 | Pedersen et al. |
| 8,494,298 B2 | 7/2013 | Lewis et al. |
| 8,965,216 B2 | 2/2015 | Oshima et al. |
| 8,965,546 B2 | 2/2015 | Visser et al. |
| 9,055,265 B2 | 6/2015 | Shintani et al. |
| 9,124,685 B2 | 9/2015 | Kulas |
| 9,137,484 B2 | 9/2015 | Difrancesco et al. |
| 9,180,053 B2 * | 11/2015 | Dalal .................. A61F 9/08 |
| 9,191,767 B2 | 11/2015 | Hopkins |
| 9,197,925 B2 * | 11/2015 | Alberth .............. H04N 21/4312 |

(Continued)

FOREIGN PATENT DOCUMENTS

| | | |
|---|---|---|
| EP | 0701366 A2 | 3/1996 |
| JP | 3037041 B2 | 4/2000 |

(Continued)

OTHER PUBLICATIONS

Anabel Martin Gonzalez, "Advanced Imaging in Head-Mounted Displays for Patients with Age-Related Macular Degeneration", Dissertation, Technical University of Munich, Jun. 29, 2011 (pp. 1-149).

(Continued)

*Primary Examiner* — Duc Nguyen
*Assistant Examiner* — Kile Blair
(74) *Attorney, Agent, or Firm* — John L. Rogitz

(57) ABSTRACT

Audio is shifted from being played on a central speaker element to either the right or left side speaker to accommodate a viewer suffering from macular degeneration moving his head to better see the visual display with his peripheral vision. If the user moves his head to the left to use the peripheral vision on the right, the audio is moved to the left speaker. Likewise, if the viewer is moving his head to the right, to take advantage of the peripheral vision on the left, then the audio switches to the right speaker.

11 Claims, 9 Drawing Sheets

(56) References Cited

U.S. PATENT DOCUMENTS

| | | | |
|---|---|---|---|
| 9,241,620 | B1 | 1/2016 | Kockan |
| 9,257,114 | B2 | 2/2016 | Tanaka |
| 9,263,027 | B2 | 2/2016 | Hopkins et al. |
| 9,489,928 | B2 | 11/2016 | Andrysco et al. |
| 9,596,555 | B2 | 3/2017 | Kaburlasos et al. |
| 2003/0030752 | A1 | 2/2003 | Begeja et al. |
| 2004/0246272 | A1 | 12/2004 | Ramian |
| 2005/0047624 | A1* | 3/2005 | Kleen ............... H04R 5/02 381/388 |
| 2006/0109242 | A1 | 5/2006 | Simpkins |
| 2006/0125796 | A1 | 6/2006 | Utz et al. |
| 2006/0140420 | A1* | 6/2006 | Machida ............ H04H 60/04 381/116 |
| 2007/0109324 | A1 | 5/2007 | Lin |
| 2008/0112614 | A1 | 5/2008 | Fluck et al. |
| 2008/0291265 | A1 | 11/2008 | Wagner et al. |
| 2009/0313582 | A1 | 12/2009 | Rupsingh et al. |
| 2010/0131983 | A1 | 5/2010 | Shannon et al. |
| 2011/0035031 | A1 | 2/2011 | Faenger et al. |
| 2011/0043644 | A1 | 2/2011 | Munger et al. |
| 2012/0167154 | A1 | 6/2012 | Kim et al. |
| 2012/0324493 | A1 | 12/2012 | Holmdahl et al. |
| 2013/0121515 | A1 | 5/2013 | Hooley et al. |
| 2013/0133022 | A1 | 5/2013 | Bi et al. |
| 2013/0230099 | A1 | 9/2013 | Deforest et al. |
| 2014/0196129 | A1 | 7/2014 | Amin |
| 2014/0254828 | A1 | 9/2014 | Ray et al. |
| 2014/0267284 | A1 | 9/2014 | Blanche et al. |
| 2014/0287779 | A1 | 9/2014 | O'Keefe et al. |
| 2014/0314261 | A1 | 10/2014 | Selig et al. |
| 2014/0356848 | A1 | 12/2014 | Peterson |
| 2015/0045003 | A1 | 2/2015 | Vora et al. |
| 2015/0153912 | A1 | 6/2015 | Reily et al. |
| 2015/0289124 | A1* | 10/2015 | Palin ............... H04W 8/005 455/41.2 |
| 2015/0309709 | A1 | 10/2015 | Kulkarni et al. |
| 2015/0373295 | A1 | 12/2015 | Outters |
| 2016/0014540 | A1* | 1/2016 | Kelly ............... H04R 1/403 381/303 |
| 2016/0021481 | A1 | 1/2016 | Johnson et al. |
| 2016/0063894 | A1 | 3/2016 | Lee |
| 2016/0078594 | A1 | 3/2016 | Scherlen |
| 2016/0170617 | A1 | 6/2016 | Shi et al. |
| 2016/0198941 | A1 | 7/2016 | Aguilar et al. |
| 2016/0239253 | A1 | 8/2016 | Staffaroni et al. |
| 2016/0282624 | A1 | 9/2016 | Munger et al. |
| 2016/0320935 | A1 | 11/2016 | Shin et al. |
| 2017/0265016 | A1* | 9/2017 | Oh ............... H04S 7/303 |
| 2017/0360295 | A1 | 12/2017 | Oz et al. |
| 2018/0064330 | A1 | 3/2018 | Markus et al. |
| 2018/0129518 | A1 | 5/2018 | Lee |

FOREIGN PATENT DOCUMENTS

| | | |
|---|---|---|
| JP | 2008236299 A | 10/2008 |
| KR | 100260702 B1 | 7/2000 |

OTHER PUBLICATIONS

Carlos Aguilar, Eric Castet, "Evaluation of a gaze-controlled vision enhancement system for reading in visually impaired people", Nice Sophia Antipolis University, Aix Marseille University, Apr. 5, 2017, Nice, France, Marseille, France.

James Ohene-Djan, Rachel Shipsey, "E-Subtitles: Emotional Subtitles as a Technology to assist the Deaf and Hearing-Impaired when Learning from Television and Film.". Goldsmiths College, University of London, 2006, New Cross, London.

John L. Sibert, Mehmet Gokturk, Robert A. Lavine, "The Reading Assistant: Eye Gaze Triggered Auditory Prompting for Reading Remediation", George Washington University, 2000.

Kickstarter, "Nura: Headphones that learn and adapt to your unique hearing", launch date May 16, 2016, website: https://www.kickstarter.com/projects/nura/nura-headphones-that-learn-and-adapt-to-your-unique-hearing.

Rita Oliveira, Jorge Ferraz De Abreu, Ana Margarida Almeida, "Audio Description in Interactive Television (iTV): proposal of a collaborative and voluntary approach", Department of Communication and Arts, University of Aveiro, Sep. 2016, Aveiro, Portugal.

Robert B. Goldstein, Henry Apfelbaum, Gang Luo and Eli Peli "Dynamic Magnification of Video for People with Visual Impairment", May 2003, The Schepens Eye Research Institute, Harvard Medical School, Boston, MA, USA.

Robert Silva, "The ZVOX AV200 AccuVoice TV Speaker Makes Voices and Dialog Clear", Dec. 20, 2016 https://www.lifewire.com/the-zvox-av200-accuvoice-tv-speaker-makes-voices-and-dialog-clear-4086538?utm_source=emailshare&utm_medium=social&utm_campaign=shareurlbuttons.

Gregory Carlsson, Steven Richman, James R. Milne, "Accessibility for the Hearing Impaired Using Measurement and Object Based Audio", file history of related U.S. Appl. No. 15/590,795, filed May 9, 2017.

Brant Candelore, Mahyar Nejat, Peter Shintani, "Modifying Display Region for People with Vision Impairment", file history of related U.S. Appl. No. 15/631,669, filed Jun. 23, 2017.

Brant Candelore, Mahyar Nejat, Peter Shintani, "Modifying Display Region for People with Loss of Peripheral Vision", file history of related U.S. Appl. No. 15/645,617, filed Jul. 10, 2017.

Brant Candelore, Mahyar Nejat, Peter Shintani, "Modifying Display Region for People with Macular Degeneration", file history of related U.S. Appl. No. 15/645,796, filed Jul. 10, 2017.

Peter Shintani, Brant Candelore, Mahyar Nejat, "Sensing Viewer Direction of Viewing to Invoke Accessibility Menu in Audio Video Device", file history of related U.S. Appl. No. 15/646,661, filed Jul. 11, 2017.

Peter Shintani, Brant Candelore, Mahyar Nejat, "Quick Accessibility Profiles", file history of related U.S. Appl. No. 15/646,986, filed Jul. 11, 2017.

Brant Candelore, Mahyar Nejat, Peter Shintani, "Modifying Display Region for People with Loss of Peripheral Vision", related U.S. Appl. No. 15/645,617, Final Office Action dated Nov. 7, 2018.

Brant Candelore, Mahyar Nejat, Peter Shintani, "Modifying Display Region for People with Loss of Peripheral Vision", related U.S. Appl. No. 15/645,617, Applicant's response to Final Office Action filed Nov. 8, 2018.

Brant Candelore, Mahyar Nejat, Peter Shintani, "Modifying Display Region for People with Macular Degeneration", related U.S. Appl. No. 15/645,796, Final Office Action dated Nov. 7, 2018.

Brant Candelore, Mahyar Nejat, Peter Shintani, "Modifying Display Region for People with Macular Degeneration", related U.S. Appl. No. 15/645,796, Applicant's response to Final Office Action filed Nov. 8, 2018.

Brant Candelore, Mahyar Nejat, Peter Shintani, "Modifying Display Region for People With Vision Impairment", related U.S. Appl. No. 15/631,669, Non-Final Office Action dated Oct. 5, 2018.

Brant Candelore, Mahyar Nejat, Peter Shintani, "Modifying Display Region for People with Loss of Peripheral Vision", related U.S. Appl. No. 15/645,617, Non-Final Office Action dated Sep. 21, 2018.

Brant Candelore, Mahyar Nejat, Peter Shintani, "Modifying Display Region for People with Loss of Peripheral Vision", related U.S. Appl. No. 15/645,617, Applicant's response to Non-Final Office Action filed Sep. 24, 2018.

Brant Candelore, Mahyar Nejat, Peter Shintani, "Modifying Display Region for People with Macular Degeneration", related U.S. Appl. No. 15/645,796, Non-Final Office Action dated Sep. 21, 2018.

Brant Candelore, Mahyar Nejat, Peter Shintani, "Modifying Display Region for People with Macular Degeneration", related U.S. Appl. No. 15/645,796, Applicant's response to Non-Final Office Action filed Sep. 24, 2018.

Brant Candelore, Mahyar Nejat, Peter Shintani, "Modifying Display Region for People with Vision Impairment", Applicant's response to non-final office action filed Oct. 11, 2018 in related U.S. Appl. No. 15/631,669.

Brant Candelore, Mahyar Nejat, Peter Shintani, "Modifying Display Region for People with Vision Impairment", related U.S. Appl. No. 15/631,669, Final Office Action dated Jan. 2, 2019.

(56) References Cited

OTHER PUBLICATIONS

Brant Candelore, Mahyar Nejat, Peter Shintani, "Modifying Display Region for People with Vision Impairment", related U.S. Appl. No. 15/631,669, Applicant's response to Final Office Action filed Jan. 4, 2019.

* cited by examiner

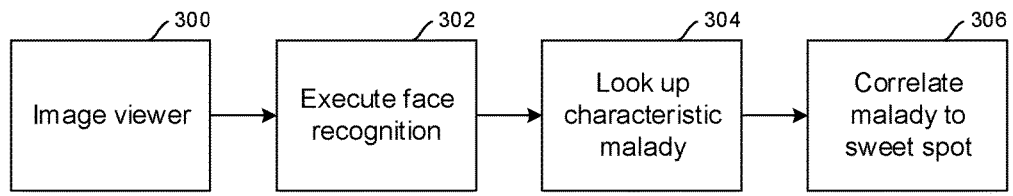
FIG. 3   Identifying sweet spot (1)
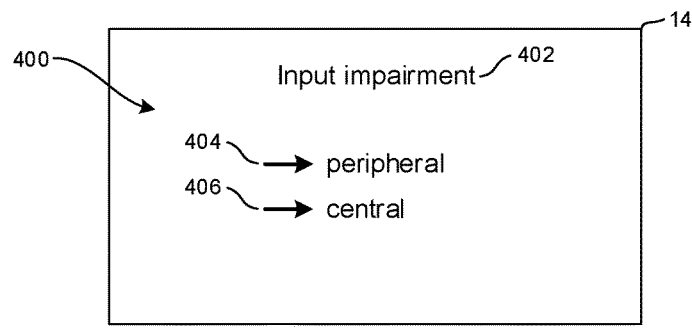
FIG. 4   Identifying sweet spot (2)
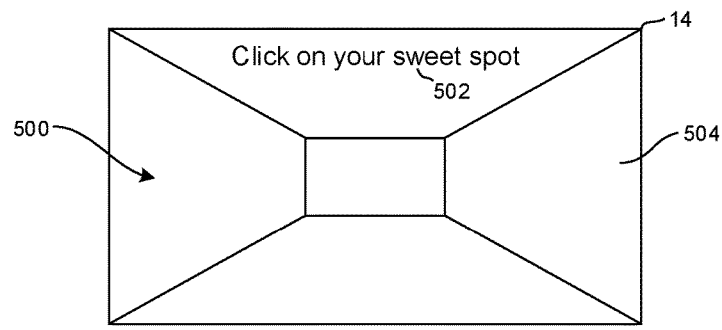
FIG. 5   Identifying sweet spot (3)

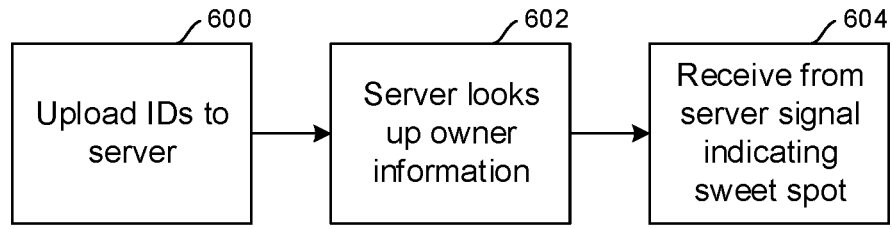
FIG. 6 Identifying sweet spot (4)
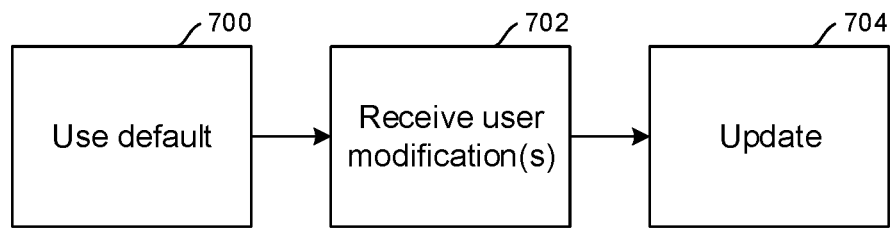
FIG. 7 Identifying video elements of interest
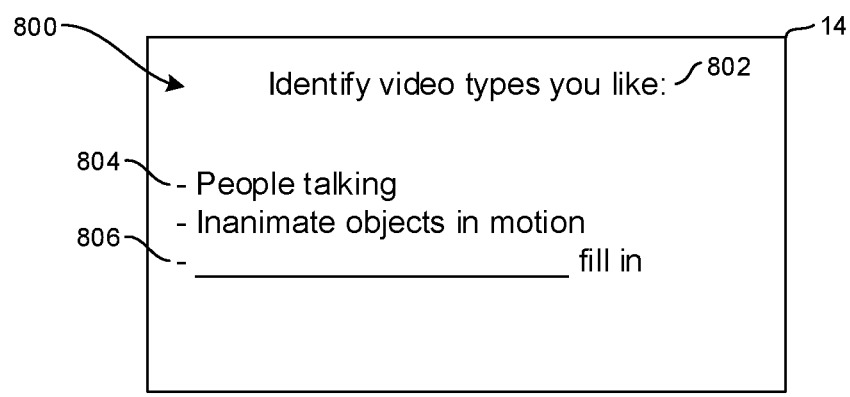
FIG. 8

FIG. 9    Identifying video elements in demanded image

Before

After

Before

After

MOVING AUDIO FROM CENTER SPEAKER TO PERIPHERAL SPEAKER OF DISPLAY DEVICE FOR MACULAR DEGENERATION ACCESSIBILITY

FIELD

The present application relates to technically inventive, non-routine solutions that are necessarily rooted in computer technology and that produce concrete technical improvements.

BACKGROUND

Visual impairments include maladies that cause loss of peripheral vision, such as glaucoma or sometimes retinitis pigmentosa, and maladies that cause loss of vision in the center of view, such as macular degeneration. People suffering from such impairments can experience difficulty viewing a video screen such as a TV because they must move their heads to see the entire video frame.

With particular respect to macular degeneration, a person suffering from this malady loses his or her center vision, so that such sufferers must cock their heads to one side in order to see anything in front of them. Perception of audio is consequently affected as one ear is cocked away from the source of sound.

SUMMARY

Present principles recognize the above problem and so moves audio from being played on a central speaker element to either the right or left side. In addition or alternatively, for audio with vertical components, audio can be moved to a speaker above the central speaker or below it depending on how the viewer's head is tilted. For simplicity, the description below assumes a horizontal head turn, it being understood that present principles apply to head tilts in the vertical dimension, i.e., with one ear tilted above the other.

As understood herein, if a viewer suffering from macular degeneration is moving his head to the left to use the peripheral vision on the right, the audio should move to the left. Likewise, if the viewer is moving his head to the right, to take advantage of the peripheral vision on the left, then the audio should switch to the right of the TV. Either a "quick setting" can be presented on a user interface (UI) to allow the viewer to quickly shift the audio (e.g., from a remote control), or an image from a camera on the display may be used to identity a viewer cocking her head and automatically moving the audio. The audio would not need to be exclusively all to one side, there could be some, greatly reduced output on the other side as well.

Accordingly, a device includes at least one computer memory that is not a transitory signal and that in turn includes instructions executable by at least one processor to identify that a peripheral region of a display device is preferred over a central region of the display device. The instructions are executable to, responsive to identifying that the peripheral region of a display device is preferred over the central region of the display device, execute at least one of: shifting audio indicated for a central speaker to a left or right speaker associated with the display device, and/or increasing a volume of a left or right speaker associated with the display device.

In some examples, the peripheral region is vertically offset from the central region, and the instructions are executable to, responsive to identifying that the peripheral region of a display device is preferred over the central region of the display device, shift audio indicated for a central speaker to an upper or lower speaker associated with the display device, and/or increase a volume of an upper or lower speaker associated with the display device.

In example embodiments, the instructions can be executable to identify that the peripheral region of the display device is preferred over the central region of the display device at least in part based on image recognition of a camera image indicating a viewer known to have macular degeneration is viewing the display device. In other examples the instructions may be executable to identify that the peripheral region of the display device is preferred over the central region of the display device at least in part based on image recognition of a camera image indicating a viewer is looking at the peripheral region.

In non-limiting embodiments, the instructions may be executable to identify that the peripheral region is on a left portion of the display, and responsive to identifying that the peripheral region is on the left side of the display, shift audio indicated for a central speaker to a left speaker associated with the display device, and/or increase a volume of a left speaker associated with the display device.

As set forth in further detail below, the instructions can be executable to identify that the peripheral region of the display device is preferred over the central region of the display device at least in part based on input received from a user interface (UI) presented on the display device.

In another aspect, a method includes identifying that a peripheral region of a display device is preferred over a central region of the display device. Responsive to identifying that the peripheral region of a display device is preferred over the central region of the display device, audio indicated for a central speaker is shifted to a left or right speaker associated with the display device. In addition or alternatively, responsive to identifying that the peripheral region of a display device is preferred over the central region of the display device, a volume of a left or right speaker associated with the display device is increased.

In another aspect, a system includes at least one display for presenting video, at least one center speaker, and at least one side speaker. At least one processor is configured with instructions for moving audio from being played on the central speaker to being played on the side speaker responsive to a determination that a viewer is looking toward the side speaker. In addition or alternatively, the audio can be moved from being played on the central speaker to being played on the side speaker responsive to reception of a command from a wireless device to move audio to the side speaker. In addition or alternatively, the volume of the side speaker may be increased automatically responsive to a determination that a viewer is looking toward the side speaker.

The details of the present disclosure, both as to its structure and operation, can be best understood in reference to the accompanying drawings, in which like reference numerals refer to like parts, and in which:

BRIEF DESCRIPTION OF THE DRAWINGS

FIG. 3 is a flow chart of example logic for identifying the display "sweet spot" for the visually-impaired viewer, according to a first embodiment;

FIGS. 4 and 5 are screen shots of example interfaces for identifying the display "sweet spot" for the visually-impaired viewer, according to respective second and third embodiments;

FIG. 6 is a flow chart of example logic for identifying the display "sweet spot" for the visually-impaired viewer, according to a fourth embodiment;

FIG. 7 is a flow chart of example logic for identifying (defining) video elements of interest to be moved to the sweet spot and magnified;

FIG. 8 is an example screen shot of an interface related to FIG. 7;

DETAILED DESCRIPTION

Figure 1:
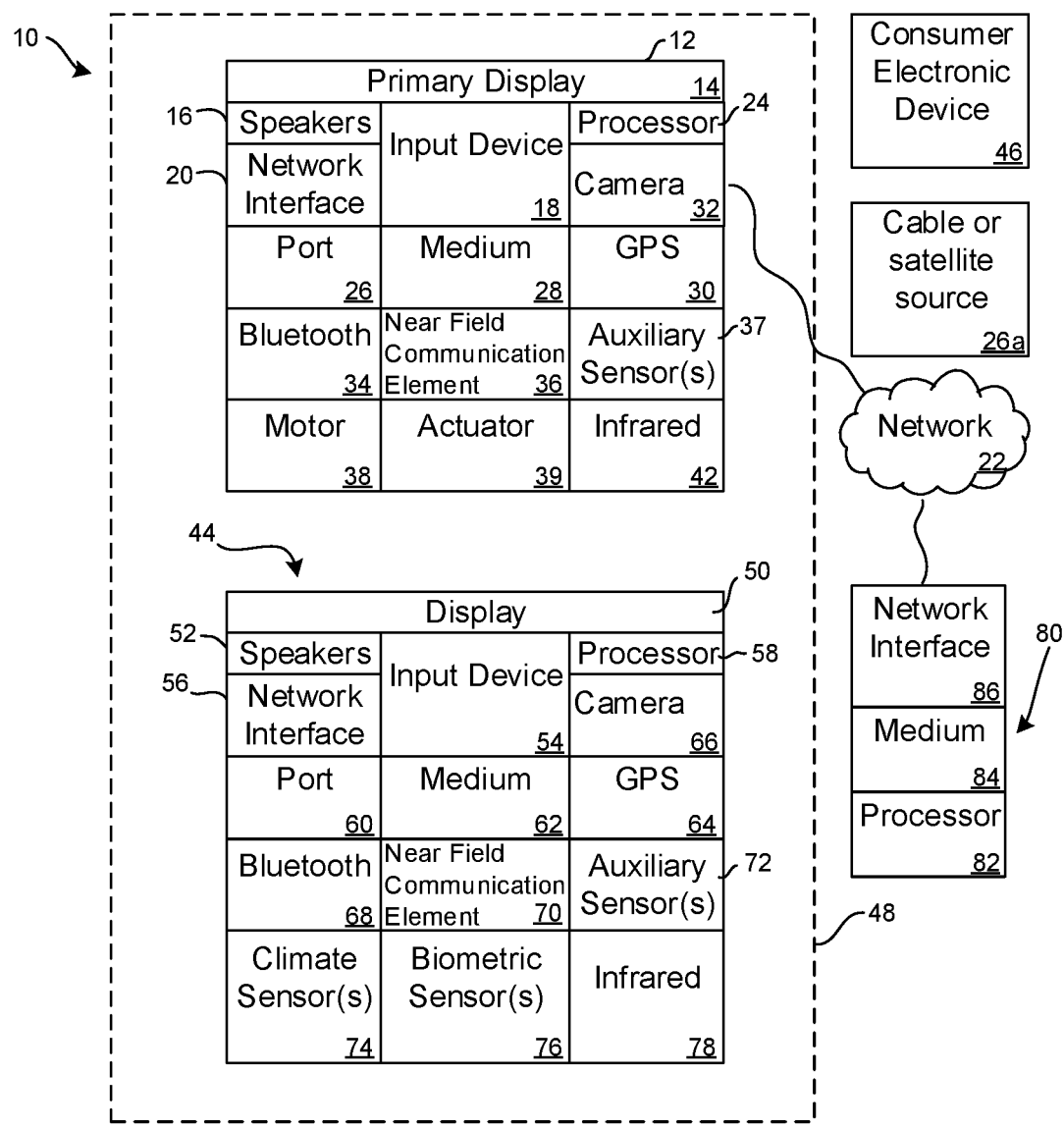
FIG. 1 is a block diagram of an example system including an example in accordance with present principles.

This disclosure relates generally to computer ecosystems including aspects of consumer electronics (CE) device based user information in computer ecosystems. A system herein may include server and client components, connected over a network such that data may be exchanged between the client and server components. The client components may include one or more computing devices including portable televisions (e.g. smart TVs, Internet-enabled TVs), portable computers such as laptops and tablet computers, and other mobile devices including smart phones and additional examples discussed below. These client devices may operate with a variety of operating environments. For example, some of the client computers may employ, as examples, operating systems from Microsoft, or a Unix operating system, or operating systems produced by Apple Computer or Google. These operating environments may be used to execute one or more browsing programs, such as a browser made by Microsoft or Google or Mozilla or other browser program that can access web applications hosted by the Internet servers discussed below.

Servers may include one or more processors executing instructions that configure the servers to receive and transmit data over a network such as the Internet. Or, a client and server can be connected over a local intranet or a virtual private network. A server or controller may be instantiated by a game console such as a Sony Playstation®, a personal computer, etc.

Information may be exchanged over a network between the clients and servers. To this end and for security, servers and/or clients can include firewalls, load balancers, temporary storages, and proxies, and other network infrastructure for reliability and security. One or more servers may form an apparatus that implement methods of providing a secure community such as an online social website to network members.

As used herein, instructions refer to computer-implemented steps for processing information in the system. Instructions can be implemented in software, firmware or hardware and include any type of programmed step undertaken by components of the system.

A processor may be any conventional general purpose single- or multi-chip processor that can execute logic by means of various lines such as address lines, data lines, and control lines and registers and shift registers.

Software modules described by way of the flow charts and user interfaces herein can include various sub-routines, procedures, etc. Without limiting the disclosure, logic stated to be executed by a particular module can be redistributed to other software modules and/or combined together in a single module and/or made available in a shareable library.

Present principles described herein can be implemented as hardware, software, firmware, or combinations thereof; hence, illustrative components, blocks, modules, circuits, and steps are set forth in terms of their functionality.

Further to what has been alluded to above, logical blocks, modules, and circuits described below can be implemented or performed with a general purpose processor, a digital signal processor (DSP), a field programmable gate array (FPGA) or other programmable logic device such as an application specific integrated circuit (ASIC), discrete gate or transistor logic, discrete hardware components, or any combination thereof designed to perform the functions described herein. A processor can be implemented by a controller or state machine or a combination of computing devices.

The functions and methods described below, when implemented in software, can be written in an appropriate language such as but not limited to C# or C++, and can be stored on or transmitted through a computer-readable storage medium such as a random access memory (RAM), read-only memory (ROM), electrically erasable programmable read-only memory (EEPROM), compact disk read-only memory (CD-ROM) or other optical disk storage such as digital versatile disc (DVD), magnetic disk storage or other magnetic storage devices including removable thumb drives, etc. A connection may establish a computer-readable medium. Such connections can include, as examples, hardwired cables including fiber optics and coaxial wires and digital subscriber line (DSL) and twisted pair wires.

Components included in one embodiment can be used in other embodiments in any appropriate combination. For example, any of the various components described herein and/or depicted in the Figures may be combined, interchanged or excluded from other embodiments.

"A system having at least one of A, B, and C" (likewise "a system having at least one of A, B, or C" and "a system having at least one of A, B, C") includes systems that have A alone, B alone, C alone, A and B together, A and C together, B and C together, and/or A, B, and C together, etc.

Now specifically referring to FIG. 1, an example ecosystem 10 is shown, which may include one or more of the example devices mentioned above and described further below in accordance with present principles. The first of the example devices included in the system 10 is an example primary display device, and in the embodiment shown is an audio video display device (AVDD) 12 such as but not limited to an Internet-enabled TV. Thus, the AVDD 12 alternatively may be an appliance or household item, e.g. computerized Internet enabled refrigerator, washer, or dryer.

The AVDD 12 alternatively may also be a computerized Internet enabled ("smart") telephone, a tablet computer, a notebook computer, a wearable computerized device such as e.g. computerized Internet-enabled watch, a computerized Internet-enabled bracelet, other computerized Internet-enabled devices, a computerized Internet-enabled music player, computerized Internet-enabled head phones, a computerized Internet-enabled implantable device such as an implantable skin device, etc. Regardless, it is to be understood that the AVDD 12 is configured to undertake present principles (e.g. communicate with other CE devices to undertake present principles, execute the logic described herein, and perform any other functions and/or operations described herein).

Accordingly, to undertake such principles the AVDD 12 can be established by some or all of the components shown in FIG. 1. For example, the AVDD 12 can include one or more displays 14 that may be implemented by a high definition or ultra-high definition "4K" or "8K" (or higher resolution) flat screen and that may be touch-enabled for receiving consumer input signals via touches on the display. The AVDD 12 may include one or more speakers 16 for outputting audio in accordance with present principles, and at least one additional input device 18 such as e.g. an audio receiver/microphone for e.g. entering audible commands to the AVDD 12 to control the AVDD 12. The example AVDD 12 may also include one or more network interfaces 20 for communication over at least one network 22 such as the Internet, an WAN, an LAN, etc. under control of one or more processors 24. Thus, the interface 20 may be, without limitation, a Wi-Fi transceiver, which is an example of a wireless computer network interface. It is to be understood that the processor 24 controls the AVDD 12 to undertake present principles, including the other elements of the AVDD 12 described herein such as e.g. controlling the display 14 to present images thereon and receiving input therefrom. Furthermore, note the network interface 20 may be, e.g., a wired or wireless modem or router, or other appropriate interface such as, e.g., a wireless telephony transceiver, or Wi-Fi transceiver as mentioned above, etc.

In addition to the foregoing, the AVDD 12 may also include one or more input ports 26 such as, e.g., a USB port to physically connect (e.g. using a wired connection) to another CE device and/or a headphone port to connect headphones to the AVDD 12 for presentation of audio from the AVDD 12 to a consumer through the headphones. The AVDD 12 may further include one or more computer memories 28 that are not transitory signals, such as disk-based or solid state storage (including but not limited to flash memory). Also in some embodiments, the AVDD 12 can include a position or location receiver such as but not limited to a cellphone receiver, GPS receiver and/or altimeter 30 that is configured to e.g. receive geographic position information from at least one satellite or cellphone tower and provide the information to the processor 24 and/or determine an altitude at which the AVDD 12 is disposed in conjunction with the processor 24. However, it is to be understood that that another suitable position receiver other than a cellphone receiver, GPS receiver and/or altimeter may be used in accordance with present principles to e.g. determine the location of the AVDD 12 in e.g. all three dimensions.

Continuing the description of the AVDD 12, in some embodiments the AVDD 12 may include one or more cameras 32 that may be, e.g., a thermal imaging camera, a digital camera such as a webcam, and/or a camera integrated into the AVDD 12 and controllable by the processor 24 to gather pictures/images and/or video in accordance with present principles. Also included on the AVDD 12 may be a Bluetooth transceiver 34 and other Near Field Communication (NFC) element 36 for communication with other devices using Bluetooth and/or NFC technology, respectively. An example NFC element can be a radio frequency identification (RFID) element.

Further still, the AVDD 12 may include one or more auxiliary sensors 37 (e.g., a motion sensor such as an accelerometer, gyroscope, cyclometer, or a magnetic sensor, an infrared (IR) sensor, an optical sensor, a speed and/or cadence sensor, a gesture sensor (e.g. for sensing gesture command, etc.) providing input to the processor 24. The AVDD 12 may include still other sensors such as e.g. one or more climate sensors 38 (e.g. barometers, humidity sensors, wind sensors, light sensors, temperature sensors, etc.) and/or one or more biometric sensors 40 providing input to the processor 24. In addition to the foregoing, it is noted that the AVDD 12 may also include an infrared (IR) transmitter and/or IR receiver and/or IR transceiver 42 such as an IR data association (IRDA) device. A battery (not shown) may be provided for powering the AVDD 12.

Still referring to FIG. 1, in addition to the AVDD 12, the system 10 may include one or more other CE device types. In one example, a first CE device 44 may be used to control the display via commands sent through the below-described server while a second CE device 46 may include similar components as the first CE device 44 and hence will not be discussed in detail. In the example shown, only two CE devices 44, 46 are shown, it being understood that fewer or greater devices may be used.

In the example shown, to illustrate present principles all three devices 12, 44, 46 are assumed to be members of an entertainment network in, e.g., in a home, or at least to be present in proximity to each other in a location such as a house. However, for illustrating present principles the first CE device 44 is assumed to be in the same room as the AVDD 12, bounded by walls illustrated by dashed lines 48.

The example non-limiting first CE device 44 may be established by any one of the above-mentioned devices, for example, a portable wireless laptop computer or notebook computer, and accordingly may have one or more of the components described below. The second CE device 46 without limitation may be established by a wireless telephone. The second CE device 46 may implement a portable hand-held remote control (RC).

The first CE device 44 may include one or more displays 50 that may be touch-enabled for receiving consumer input signals via touches on the display. The first CE device 44 may include one or more speakers 52 for outputting audio in accordance with present principles, and at least one additional input device 54 such as e.g. an audio receiver/microphone for e.g. entering audible commands to the first CE device 44 to control the device 44. The example first CE device 44 may also include one or more network interfaces 56 for communication over the network 22 under control of one or more CE device processors 58. Thus, the interface 56 may be, without limitation, a Wi-Fi transceiver, which is an example of a wireless computer network interface. It is to be understood that the processor 58 may control the first CE device 44 to undertake present principles, including the other elements of the first CE device 44 described herein such as e.g. controlling the display 50 to present images thereon and receiving input therefrom. Furthermore, note the network interface 56 may be, e.g., a wired or wireless modem or router, or other appropriate interface such as, e.g., a wireless telephony transceiver, or Wi-Fi transceiver as mentioned above, etc.

In addition to the foregoing, the first CE device 44 may also include one or more input ports 60 such as, e.g., a USB port to physically connect (e.g. using a wired connection) to another CE device and/or a headphone port to connect headphones to the first CE device 44 for presentation of audio from the first CE device 44 to a consumer through the headphones. The first CE device 44 may further include one or more computer memories 62 such as disk-based or solid state storage. Also in some embodiments, the first CE device 44 can include a position or location receiver such as but not limited to a cellphone and/or GPS receiver and/or altimeter 64 that is configured to e.g. receive geographic position information from at least one satellite and/or cell tower, using triangulation, and provide the information to the CE device processor 58 and/or determine an altitude at which the first CE device 44 is disposed in conjunction with the CE device processor 58. However, it is to be understood that that another suitable position receiver other than a cellphone and/or GPS receiver and/or altimeter may be used in accordance with present principles to e.g. determine the location of the first CE device 44 in e.g. all three dimensions.

Continuing the description of the first CE device 44, in some embodiments the first CE device 44 may include one or more cameras 66 that may be, e.g., a thermal imaging camera, a digital camera such as a webcam, and/or a camera integrated into the first CE device 44 and controllable by the CE device processor 58 to gather pictures/images and/or video in accordance with present principles. Also included on the first CE device 44 may be a Bluetooth transceiver 68 and other Near Field Communication (NFC) element 70 for communication with other devices using Bluetooth and/or NFC technology, respectively. An example NFC element can be a radio frequency identification (RFID) element.

Further still, the first CE device 44 may include one or more auxiliary sensors 72 (e.g., a motion sensor such as an accelerometer, gyroscope, cyclometer, or a magnetic sensor, an infrared (IR) sensor, an optical sensor, a speed and/or cadence sensor, a gesture sensor (e.g. for sensing gesture command, etc.) providing input to the CE device processor 58. The first CE device 44 may include still other sensors such as e.g. one or more climate sensors 74 (e.g. barometers, humidity sensors, wind sensors, light sensors, temperature sensors, etc.) and/or one or more biometric sensors 76 providing input to the CE device processor 58. In addition to the foregoing, it is noted that in some embodiments the first CE device 44 may also include an infrared (IR) transmitter and/or IR receiver and/or IR transceiver 78 such as an IR data association (IRDA) device. A battery (not shown) may be provided for powering the first CE device 44.

The second CE device 46 may include some or all of the components shown for the CE device 44.

Now in reference to the afore-mentioned at least one server 80, it includes at least one server processor 82, at least one computer memory 84 such as disk-based or solid state storage, and at least one network interface 86 that, under control of the server processor 82, allows for communication with the other devices of FIG. 1 over the network 22, and indeed may facilitate communication between servers and client devices in accordance with present principles. Note that the network interface 86 may be, e.g., a wired or wireless modem or router, Wi-Fi transceiver, or other appropriate interface such as, e.g., a wireless telephony transceiver.

Accordingly, in some embodiments the server 80 may be an Internet server, and may include and perform "cloud" functions such that the devices of the system 10 may access a "cloud" environment via the server 80 in example embodiments. Or, the server 80 may be implemented by a game console or other computer in the same room as the other devices shown in FIG. 1 or nearby.

Figure 2:
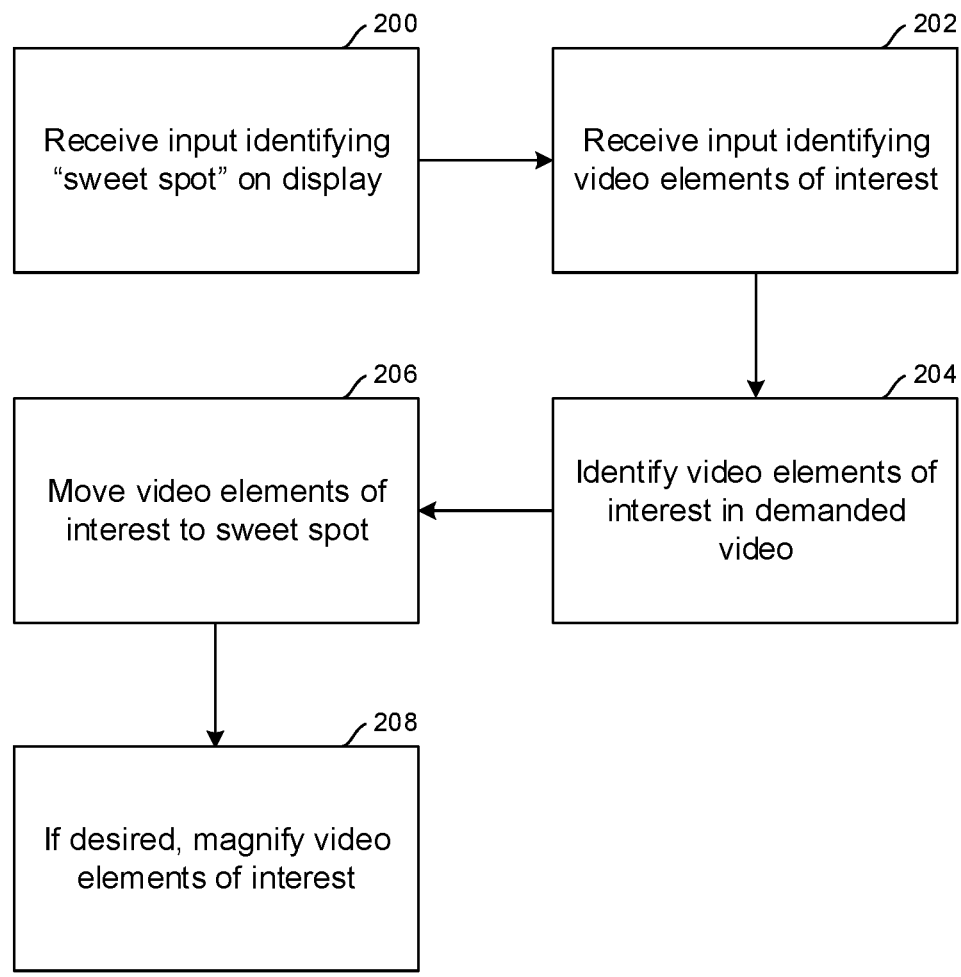
FIG. 2 is a flow chart of example overall logic consistent with present principles.

FIG. 2 shows an example overall logic flow. Commencing at block 200, input is received indicating a "sweet spot" on the display 14. The "sweet spot" is an area of the display less than the total display area and may be determined as further described below.

Moving to block 202, input is received identifying video elements or items of interest, described further below. Then, when video is selected for play, at block 204 video elements or items of interest are identified in the video and at block 206 moved to the "sweet spot" in video frame identified at block 200. If desired, the relocated video items of interest may be magnified or otherwise enlarged at block 208 to be a greater size than the size they had when originally received. Magnification may be accomplished by adding extrapolated pixels between pixels of the originally-sized video object of interest 500 or by other suitable means.

FIG. 3 illustrates a first embodiment for identifying the sweet spot at block 200. At block 300 a viewer of the AVDD 12 is imaged using, e.g., the camera 32. Image recognition may be executed on the image at block 302 by the AVDD processor 24 or, if desired, the image may be offloaded to the CE device 44 or to the server 80 and image recognition executed there. At block 304 the AVDD processor or the server or other processor executing image recognition can look up, based on the image, a malady characteristic of the image, which is correlated to the sweet spot at block 306.

For example, if image recognition indicates that the viewer constantly has his or her head cocked to one side, with the periphery of the eyes turned directly toward the AVDD, that image may be correlated to "macular degeneration". On the other hand, if a series of images reveals that the user is constantly turning his or her head right and left in a constant or near-constant swivel motion, that set of images may be correlated to glaucoma.

FIG. 4 shows an alternate method for identifying the sweet spot at block 200. A user interface (UI) 400 may be presented on the display 14 (additionally or alternatively, may be spoken using the speakers 16) with a prompt 404 for a viewer to indicate an impairment. In the example shown, a first selector 404 may be selected to indicate peripheral vision impairment, as in glaucoma (in which case the sweet spot would be the center of the display), while a second selector 406 may be selected to indicate central vision impairment, as in macular degeneration (in which case the sweet spot would be the left and/or right periphery of the display). Similar visible or audible indicators may be presented for a user to speak his or her impairment.

FIG. 5 shows yet another method for identifying the sweet spot at block 200. A UI 500 may be presented on the display 14 (additionally or alternatively, may be spoken using the speakers 16) with a prompt 502 for a viewer to select his or her sweet spot. The prompt may be visible as shown or audible. For visible entry the UI may be lined with multiple regions 504 as shown, and a viewer need simply operate a remote control or touch screen to move a screen cursor over the preferred area and select the area to define the sweet spot. For audible entry a user need only speak the region of the display desired, e.g., "left side" or "center". FIG. 5 may be overlaid on video for dynamic selection of the sweet spot by the user and may be invoked from a settings menu.

FIG. 6 shows yet another method for identifying the sweet spot at block 200. At block 600 one or more IDs are uploaded to the server 80. For example, the user's ID as input by the user or obtained from face recognition using images from the camera 32 may be uploaded, and/or the ID (e.g., model number or serial number) of the AVDD may be uploaded. The server, using the ID(s) at block 602, looks up personal information associated with the IDs, for example with the user ID or with a user profile associated with the device ID, with the personal information indicating either a specific malady or the sweet spot associated with the malady. The AVDD 12 receives back from the server at block 604 a signal useful for indicating the sweet spot.

FIG. 7 shows an example logic flow of identifying video items of interest in a video to magnify and/or move those items according to description below. A default set of video items of interest may be identified at block 700. The default set may include video object types, for example, someone speaking, an object moving whose motion vectors satisfy a speed threshold, an object moving in a particular back background such as a vehicle coming up a valley, etc.

At block 702 user modifications, such as additions and deletions, to the default set may be received. The set of video items of interest is then updated according to the user modifications at block 704.

FIG. 8 illustrates an example user interface (UI) 800 that may be presented, e.g., on the display 14 of the AVDD 12. The UI 800 may also or alternatively be presented audibly on the speakers 16. The UI 800 may be presented alternatively or in addition on another device, such as the CE device 44.

The UI 800 may include a prompt 802 to the user to identify particular video items of interest the user prefers. Various predefined options 804 may be presented and may be selected to add them to the default set discussed above. Also, a field 806 may be provided to enable the user to type in (using, e.g., a keypad such as any of those described above) or speak (using, e.g., a microphone such as any of those described above) a video object type that may not appear in the predefined list of options 804. Toggling a selection may remove it from the set of video items of interest.

For ease of description the discussion below focuses on visually magnifying video items of interest, it being understood that for visually impaired people, sound associated with video items of interest may be amplified above the current volume setting of the AVDD.

Figure 9:
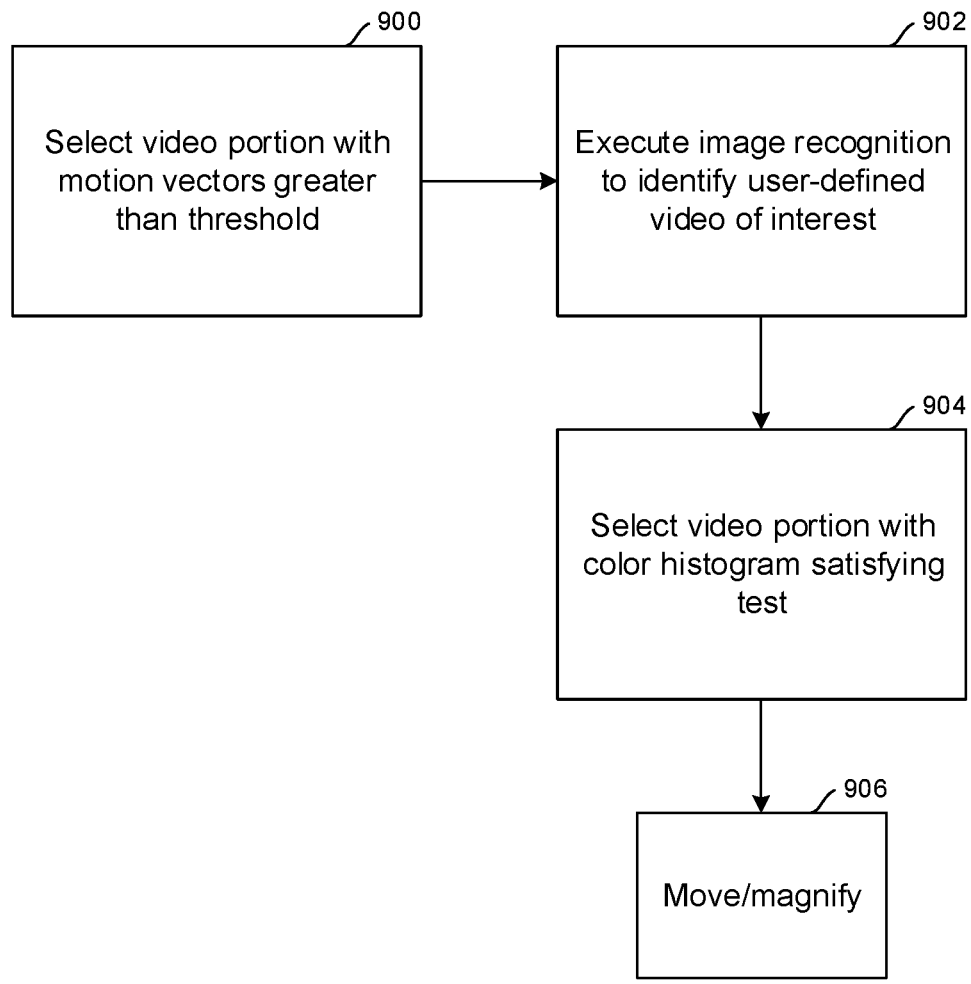
FIG. 9 is a flow chart of example logic for identifying predefined video elements of interest in a demanded video stream.

Once video items of interest are defined, the logic of FIG. 9 may be executed. It is to be understood that in executing logic herein, it may be assumed that the viewer will sit a predetermined proper distance from the AVDD to make the magnified/moved image fit in what can be seen without requiring the viewer to move his head left to right or up and down.

In the example of FIG. 9, at block 900 the processor of the AVDD 12 or other suitable processor communicating with the AVDD 12 selects a portion of a video frame or frames less than 100% of the frame (but greater than zero) in which motion vectors associated with the portion in I-macroblocks of the video satisfy a threshold, typically by meeting or exceeding a magnitude threshold. In other words, block 900 assumes that a video element of interest is one that is moving relatively quickly in the video.

In addition or alternatively, image recognition may be executed on the video at block 902 to identify objects in the list of video elements of interest discussed above, including user-defined objects of interest. Yet again, at block 904 in addition or alternatively to the selections at blocks 900 and 902, a portion of a video frame or frames less than 100% of the frame but greater than zero is selected based on the portion having a color histogram satisfying a test, such as a histogram indicating a wide range of colors in the selected portion.

Proceeding to block 906 the items of interest are moved to the "sweet spot" from the video frame locations in which they were received, and if desired magnified in the new location in the "sweet spot". Equivalently, for hearing-impaired viewers the sound associated with video items of interest is amplified to a louder volume than the current volume setting of the AVDD.

Figure 10:
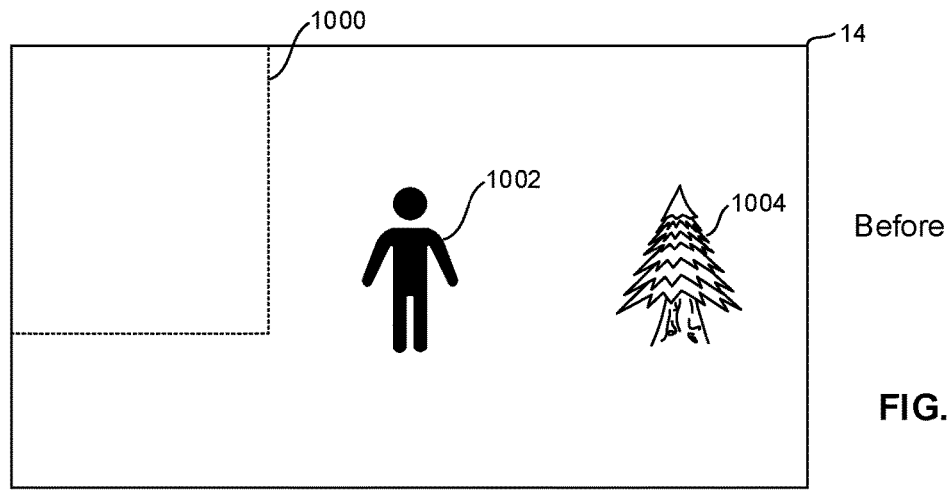
FIGS. 10 and 11 are before and after depictions, respectively, of video presentation illustrating the effects of moving a video element of interest to a first sweet spot appropriate for viewers suffering from a central viewing malady such as macular degeneration.
Figure 11:
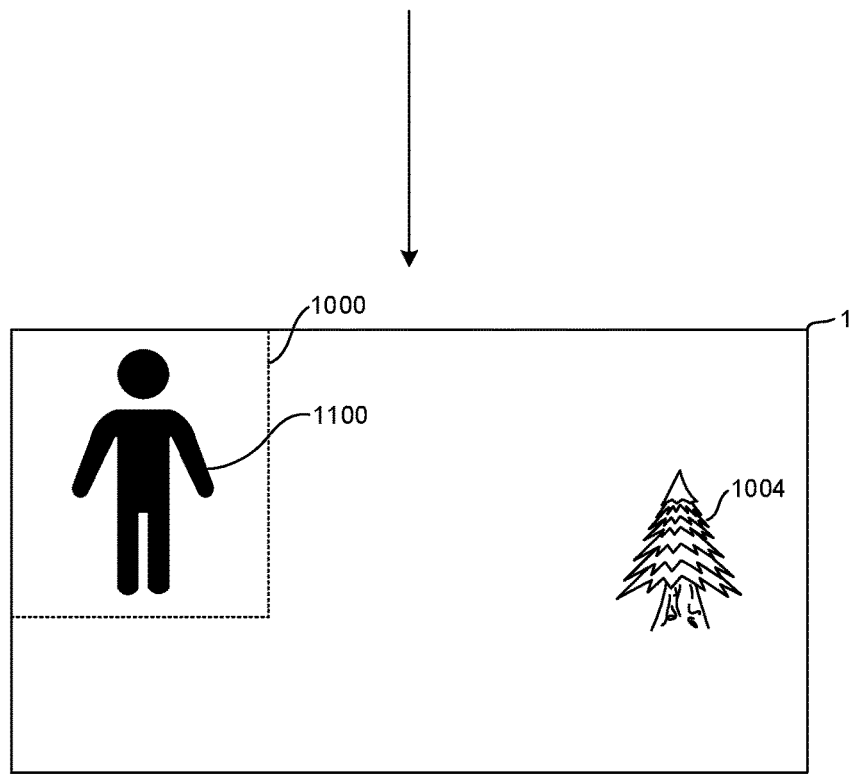

FIGS. 10 and 11 illustrate the above principles in connection with a sweet spot 1000 being defined on a periphery of the display as may be the case for a viewer with macular degeneration. An item of interest 1002 is received in original video outside the sweet spot, along with an object 1004 not of interest. After the logic of FIG. 2, the item of interest is moved to 1100 in the sweet spot, in the example shown, enlarged from its original size. The object 1004 not of interest remains in its original size and location in the video frame if desired.

Figure 12:
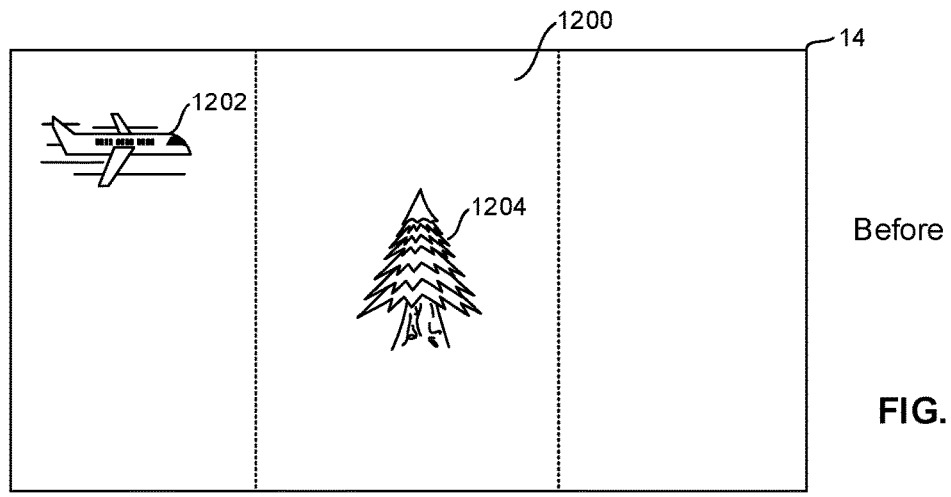
FIGS. 12 and 13 are before and after depictions, respectively, of video presentation illustrating the effects of moving a video element of interest to a second sweet spot appropriate for viewers suffering from a peripheral viewing malady such as glaucoma or retinitis pigmentosa.
Figure 13:
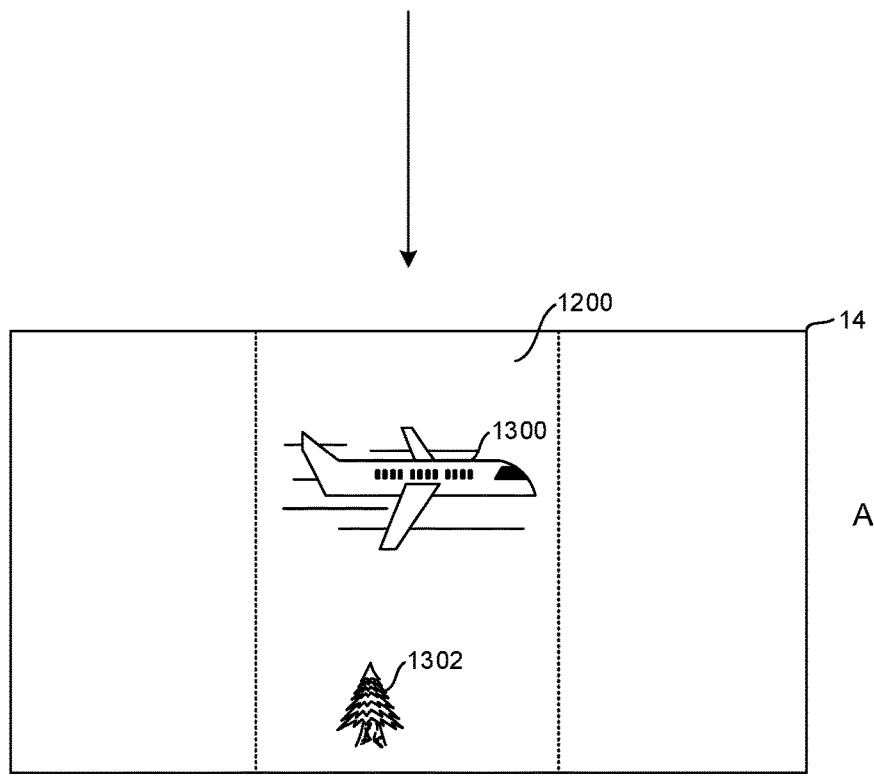

On the other hand, FIGS. 12 and 13 illustrate the above principles in connection with a sweet spot 1200 being defined in the center of the display as may be the case for a viewer with glaucoma. An item of interest 1202 is received in original video outside the sweet spot, along with an object 1204 not of interest. After the logic of FIG. 2, the item of interest is moved to 1300 in the sweet spot, in the example shown, enlarged from its original size. The object not of interest may be moved and reduced in size at 1302 so as not to interfere (e.g., overlap with) the item of interest 1302.

Figure 14:
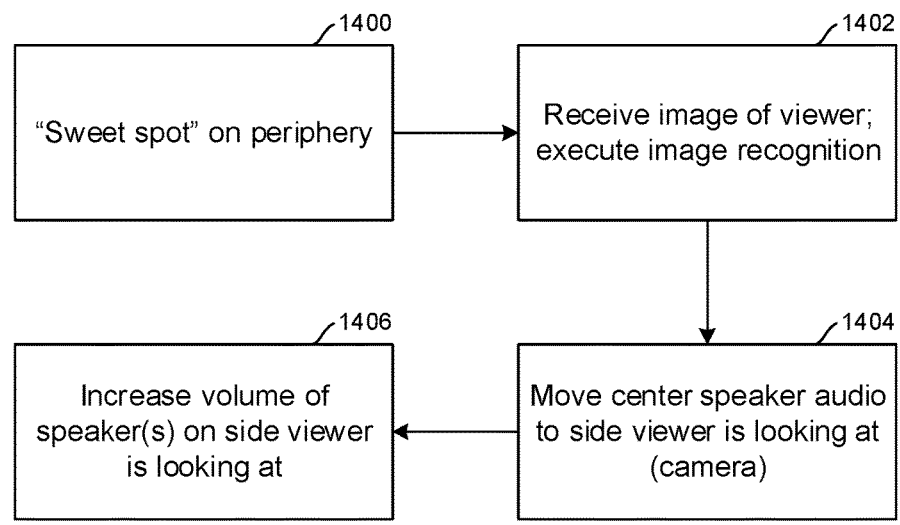
FIG. 14 is a flow chart of example logic for moving audio to accommodate macular degeneration in a viewer.
Figure 15:
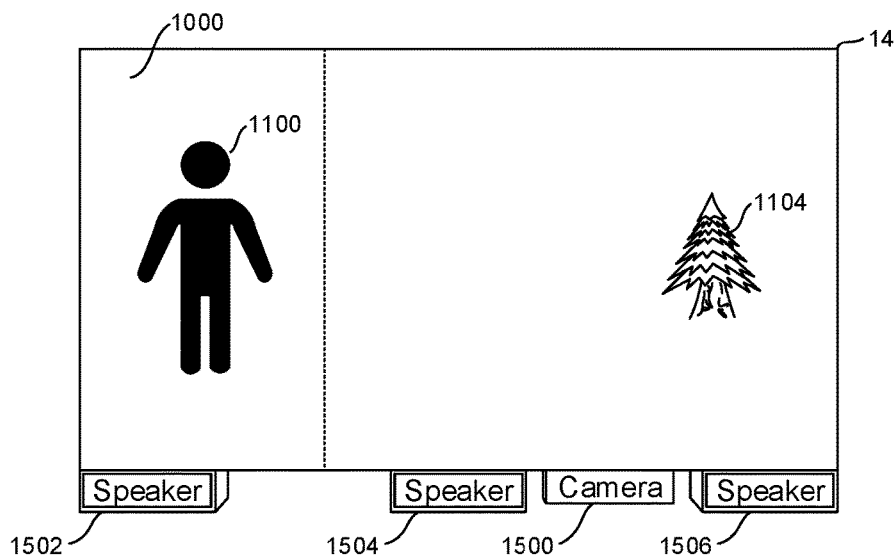
FIG. 15 is a partially schematic diagram of a display device consistent with present principles.

Now referring to FIG. 14, at block 1400 the "sweet spot" is identified to be on the periphery of the display according to disclosure above, implicating FIGS. 10 and 11 and related description, as indicated in FIG. 15. Proceeding to block 1402 of FIG. 14, if desired an image of the viewer may be received, e.g., from a camera 1500 (FIG. 15) of, e.g., the AVDD 12, and image recognition executed on the image to recognize which side of the display the viewer has his or her hear turned toward. Face recognition may be employed for this purpose, or iris recognition to determine the line along which the viewer's eyes are directed.

Proceeding to block 1404 of FIG. 14, audio that otherwise is to played on a center speaker 1504 (FIG. 15) is programmatically moved to be played on the side speaker 1502, 1506 corresponding to the side the viewer is looking at as determined at block 1402. Also or alternatively, if desired at block 1406 the volume of the side speaker 1502, 1506 corresponding to the side the viewer is looking at as determined at block 1402 can be increased automatically.

Figure 16:
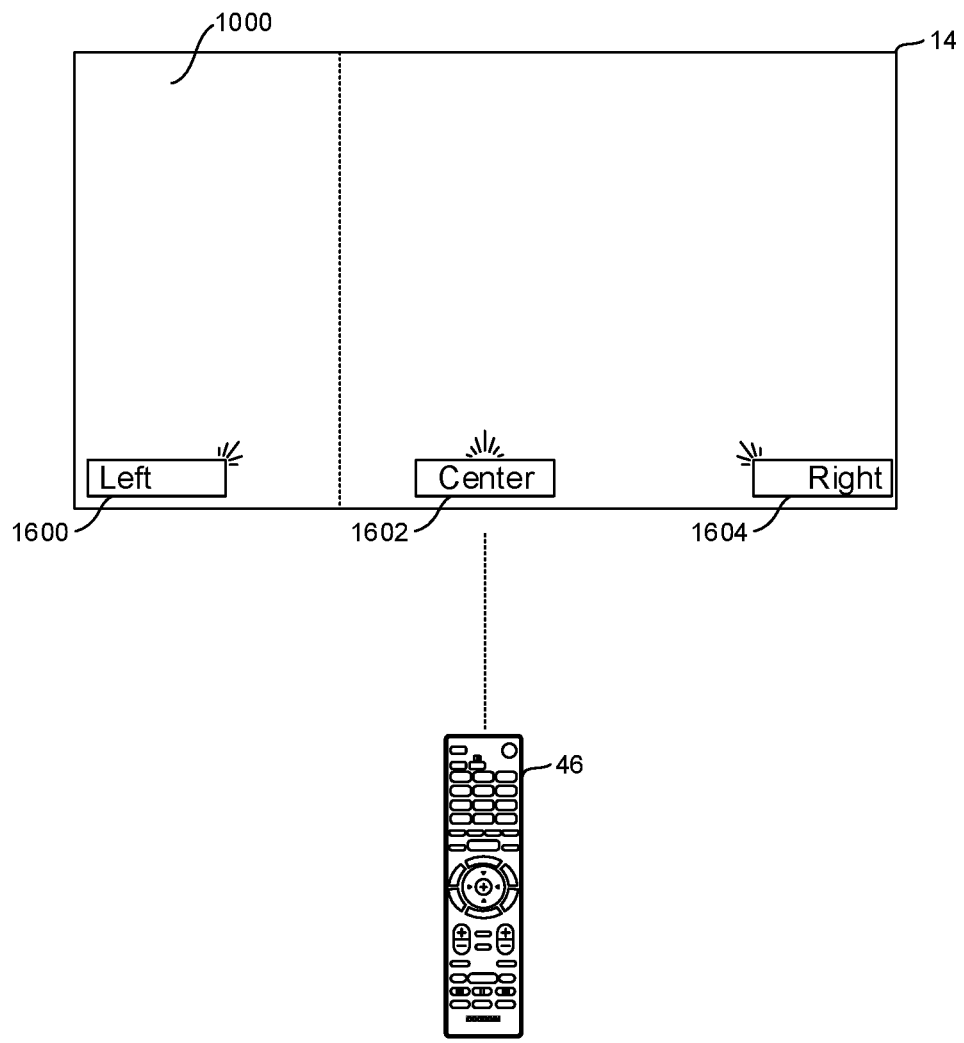
FIG. 16 is a screen shot of an example UI pertaining to aspects of FIG. 14.

FIG. 16 shows that in addition to or in lieu of face recognition, a viewer may use the CE device 46 (embodied, e.g., as a remote control) to point at a preferred speaker or speaker icon 1600, 1602, 1604 on a UI and click a "select" key on the device 46 to shift audio from one or more other speakers to the selected speaker.

While particular techniques are herein shown and described in detail, it is to be understood that the subject matter which is encompassed by the present application is limited only by the claims.

What is claimed is:

1. A method, comprising:
executing face recognition on at least one image from at least one camera; and
identifying that a peripheral region of the display device is preferred over the central region of the display device at least in part based on image recognition of a camera image indicating a viewer known to have macular degeneration is viewing the display device, and based on the identifying, shifting audio indicated for a central speaker to be played on a left or right speaker associated with the display device instead of on a central speaker.

2. The method of claim 1, comprising:

identifying that the peripheral region is on a left portion of the display; and responsive to identifying that the peripheral region is on the left side of the display, executing at least one of:

shifting audio indicated for a central speaker to a left speaker associated with the display device; and/or increasing a volume of a left speaker associated with the display device.

3. The method of claim 1, comprising:

identifying that the peripheral region of the display device is preferred over the central region of the display device at least in part based on input received from a user interface (UI) presented on the display device.

4. The method of claim 1, comprising:

at least in part based on image recognition of a camera image indicating a viewer is looking at the peripheral region, increasing a volume of a left or right speaker associated with the display device.

5. A device comprising:

at least one computer memory that is not a transitory signal and that comprises instructions executable by at least one processor to:

execute face recognition on at least one image from at least one camera; and identify that a peripheral region of the display device is preferred over the central region of the display device at least in part based on image recognition of a camera image indicating a viewer known to have macular degeneration is viewing the display device, and based on the identifying, shift audio indicated for a central speaker to be played on a left or right speaker associated with the display device instead of on a central speaker.

6. The device of claim 5, comprising the at least one processor.

7. The device of claim 6, comprising the at least one camera.

8. The device of claim 6, comprising the display device.

9. The device of claim 5, wherein the instructions are executable to:

at least in part based on face recognition implemented on a camera image indicating a viewer known to have macular degeneration is viewing a display device, execute at least one of:

shift audio indicated for the central speaker to an upper or lower speaker associated with the display device; and/or increase a volume of an upper or lower speaker associated with the display device.

10. The device of claim 5, wherein the instructions are executable to:

identify that a viewer is looking at a left portion of the display device; and responsive to identifying that the viewer is looking at the left side of the display device, execute at least one of:

shift audio indicated for the central speaker to the left speaker associated with the display device; and/or increase a volume of the left speaker associated with the display device.

11. The device of claim 5, wherein the instructions are executable to:

identify that the peripheral region of the display device is preferred over the central region of the display device at least in part based on input received from a user interface (UI) presented on the display device.

\* \* \* \* \*